(12) United States Patent
Cloke et al.

(10) Patent No.: US 6,246,346 B1
(45) Date of Patent: Jun. 12, 2001

(54) STORAGE SYSTEM EMPLOYING HIGH-RATE CODE WITH CONSTRAINT ON RUN LENGTH BETWEEN OCCURRENCES OF AN INFLUENTIAL PATTERN

(75) Inventors: Robert Leslie Cloke, Santa Clara; Patrick James Lee, San Jose, both of CA (US); Steven William McLaughlin, Decatur, GA (US)

(73) Assignee: Western Digital Corporation, Lake Forest, CA (US)

( * ) Notice: Subject to any disclaimer, the term of this patent is extended or adjusted under 35 U.S.C. 154(b) by 0 days.

(21) Appl. No.: 08/957,763

(22) Filed: Oct. 24, 1997

(51) Int. Cl.[7] .............................. H03M 5/00; H03M 7/00
(52) U.S. Cl. ................................ 341/59; 341/58
(58) Field of Search .................... 341/58, 59, 63, 341/95; 360/45, 46; 714/795

(56) References Cited

U.S. PATENT DOCUMENTS

| | | | |
|---|---|---|---|
| 3,810,111 | * 5/1974 | Patel | 341/58 X |
| 3,906,485 | * 9/1975 | Hong et al. | 341/58 |
| 4,626,829 | * 12/1986 | Hauck | 341/63 |
| 4,707,681 | 11/1987 | Eggenberger et al. | 340/347 |
| 5,196,849 | 3/1993 | Galbraith | 341/59 |
| 5,243,605 | * 9/1993 | Lekmine et al. | 714/795 |
| 5,422,760 | 6/1995 | Abbott et al. | 360/46 |
| 5,537,112 | 7/1996 | Tsang | 341/59 |

* cited by examiner

Primary Examiner—Patrick Wamsley
(74) Attorney, Agent, or Firm—Milad G. Shara

(57) ABSTRACT

A storage system employs a method for encoding a sequence of input data blocks into a sequence of codewords. Each input data block includes a first predetermined number of bits (the data block length). Each codeword includes a second predetermined number of bits (the codeword length). The code rate, i.e., the ratio of the first number to the second number, is greater than ¾. The method is performed in a sampled-data channel in a storage system; and the channel includes a circuit the performance of which is adversely affected by an excessive run length of bits between occurrences of a predetermined influential pattern. Preferably, the influential pattern is a two-bit sequence of adjacent 1's, which favorably influences the performance of a timing recovery circuit. The method includes receiving the sequence of input data blocks and generating the sequence of codewords responsive to the received sequence of input data blocks. The sequence of codewords has a constraint on the maximum run length of bits between occurrences of the influential pattern, the maximum run length of bits being less than or equal to the codeword length.

18 Claims, 11 Drawing Sheets

STORAGE SYSTEM EMPLOYING HIGH-RATE CODE WITH CONSTRAINT ON RUN LENGTH BETWEEN OCCURRENCES OF AN INFLUENTIAL PATTERN

BACKGROUND OF THE INVENTION

1. Field of the Invention

In general, this invention relates to a storage system employing a high-rate code for a data channel that employs sampled-data processing. More particularly, it relates to a method and apparatus to implement such a high-rate code involving codewords that are subject to a constraint on run length between occurrences of an influential pattern.

2. Description of the Prior Art

A channel is a major functional element of a storage system such as a hard disk drive. The channel includes a write channel and a compatible read channel. The write channel receives input data, typically as a block of data including 512 user-data bytes plus various appended ECC and EDC bytes, and responsive to the input data generates a serial signal defining write data. An important function of the channel is encoding and decoding (sometimes referred to as the "ENDEC" function). The write channel performs encoding to define a form of serial signal that, with reasonable reliability, can be recorded and be recovered in the course of the performance of decoding by the read channel. Code rate is a very significant measure of the relative value of a particular code defined by the ENDEC function. A relatively low code rate causes inefficient use of available areal bit density, which in turn generally means a relatively high cost per megabyte of storage capacity. On the other hand, a relatively high code rate contributes to more efficient use of available areal bit density, which in turn generally means a relatively lower cost per megabyte of storage capacity. In general, code rate has a value equal to the ratio of: (a) the number of bits in a data block, to (b) the number of bits in a codeword corresponding to the data block.

In a hard disk drive, the read channel receives an analog read signal from a transducer during a read operation. The analog read signal is characterized by a "channel frequency." As used in this art, "channel frequency" is the reciprocal of a time period "T," where the "T" is the time period consumed while an elemental-length magnet passes under the transducer during a read operation with the disk spinning at a constant angular velocity. In this regard, the length of each magnet recorded along a track as a result of a write operation is, to a first order of approximation, either an elemental length or an integer multiple of the elemental length. Each elemental length magnet can be referred to as a "bit cell" that is defined during a write operation.

One category of signaling processes uses peak detection for recovering data from the analog read signal. Another category uses sampled-data techniques; this category includes partial response maximum likelihood ("PRML") channels, EPR4 channels, and $E^2PR4$ channels.

In a hard disk drive employing a peak detecting channel, digital data are represented in the media by transitions between oppositely magnetized bit cells. Provided that the transitions between oppositely magnetized bit cells do not unduly interfere with each other, each such transition causes a peak in the analog read signal; and a peak-detecting channel employs a peak detector that detects such peaks, and produces digital signal in the form of a serial, binary-valued signal that is an error-prone signal for numerous reasons. One reason why the peak detector produces an error-prone signal is random noise; this source of error presents a problem for any type of channel. Another reason relates to interference between adjacent transitions. Interference between such transitions is referred to as intersymbol interference and adversely affects performance of a peak detecting channel increasingly as a function of channel rate.

A sampled-data channel employs sampling circuitry that samples the analog read signal to produce a sequence of samples. The samples so produced are provided in sequence to a detector such as a so-called "Viterbi detector" that internally produces symbols and maps the internally-produced symbols to binary-valued symbols. In a PRML channel, such internally-produced symbols are often referred to as: "−1"; "0"; and "+1"; and the binary-valued symbols are supplied to a deserializer to produce a parallel-by-bit digital signal.

Not too many years ago, a state of the art hard disk drive typically employed a peak detection read channel and a code selected from a category commonly referred to as "RLL" codes. "RLL" is an acronym for "run length limited." Examples of such RLL codes include codes commonly referred to as "1,7" codes and "2,7" codes. The code rate for a "1,7" code is ⅔ and the code rate for a "2,7" code is ½. One characteristic of such codes for peak detection channels is that a rule for the code excluded the possibility of occurrence of certain adverse sequence of bits. In a peak detection channel, because it is subject to an adverse affect (intersymbol interference) if the analog read signal were ideally to define two adjacent peaks (which in a peak detection channel is interchangeably described as two adjacent 1's; i.e., a binary "1" followed immediately by another binary "1"), the encoding step ensures that no pattern of consecutive 1's can occur in the codeword-defining stream (i.e., the concatenated sequence of codewords). Another adverse sequence of bits involves an undue run length without any peaks, which herein is interchangeably described as a run length of all 0's. In a "2,7" code, there must be at least two zeros between successive occurrences of 1's, and the maximum run length of all 0's is seven. In a "1,7" code, there must be at least one zero between successive occurrences of 1's, and the maximum run length of all 0's is seven. A general form for characterizing such codes for peak detecting channels involves the following parameters: 1) "d"—the minimum number of zeros between the successive occurrences of 1's; and 2) "k"—the maximum run length of all 0's.

A contemporary state of the art hard disk drive typically employs a sampled-data channel. In a sampled-data channel, intersymbol interference does not cause the adverse effect it causes in a peak detecting channel. Typically, therefore, codes for a sampled-data channel allow code bit streams to include adjacent 1's. Certain other characteristics of such a sampled-data channel are such that it is advisable to limit the maximum run length of all 0's in two ways, one being a "Global" and the other being on an "Interleaved" basis. A general form for characterizing such codes for a sampled-data channel involves the following parameters: 1) "d"—the minimum number of zeros between the successive occurrences of 1's; 2) "G"—the maximum run length of all 0's; and 3) −"I" the maximum run length of all 0's on an interleaved basis.

For a sampled-data channel, the parameter d typically equals 0; the d constraint can be 0 because intersymbol interference does not adversely affect the sampled-data channel. However, because a long string of consecutive 0's on a global basis can adversely affect timing recovery in the sampled-data channel, the G constraint is imposed. Because a long string of 0's on an interleaved basis can adversely affect the detector in the sampled-data channel, the I constraint is imposed. An example of a patent describing the G/I constraint is U.S. Pat. No. 4,707,681, entitled "METHOD AND APPARATUS FOR IMPLEMENTING OPTIMUM PRML CODES" ('681 patent). The terms "k" and "k1" as used in the '681 patent correspond to the parameters "G" and "I."

U.S. Pat. No. 5,422,760, entitled "DISK DRIVE METHOD USING ZONED DATA RECORDING AND PRML SAMPLING DATA DETECTION WITH DIGITAL ADAPTIVE EQUALIZATION" ('760 patent), provides background information on timing control circuits. At column 28, line 24, the '760 patent sets forth the general formula for determining a tracking mode timing error estimate.

U.S. Pat. No. 5,196,849, entitled "METHOD AND APPARATUS FOR IMPLEMENTING PRML CODES WITH MAXIMUM ONES" ('849 patent), relates generally to encoding data, and particularly to encoding and decoding for a PRML channel. The '849 patent discloses that it is desirable for a code having a rate of 8/9 to have a maximum number of 1's in the codewords.

Another patent that relates to codes for sampled-data channels is U.S. Pat. No. 5,537,112, entitled "METHOD AND APPARATUS FOR IMPLEMENTING RUN LENGTH LIMITED CODES IN PARTIAL RESPONSE CHANNELS" ('112 patent). The '112 patent discloses a high-rate code (16/17).

None of the prior art codes for sampled-data channels provides, in combination, a high code rate and a guarantee that all the codewords in the codeword set promote effective timing recovery.

There is a need for a code constraint which constrains the run length of code bits (e.g, zeros and isolated ones) to promote effective timing recovery and improve the performance of the sampled-data channel.

SUMMARY OF THE INVENTION

This invention can be regarded as a method for encoding an input data block into a codeword. The input data block includes a first predetermined number of bits and the codeword includes a second predetermined number of bits. The ratio of first predetermined number of bits to second predetermined number of bits is greater than ¾. The method is performed in a sampled data channel in a storage system; the data channel includes a circuit the performance of which is adversely affected by an excessive run length of bits between occurrences of a predetermined influential pattern. The method includes receiving the input data block and generating the codeword responsive to the received input data block. The codeword has a constraint on the maximum run length of bits between occurrences of the influential pattern.

In accordance with a feature of the invention, the step of generating the codeword responsive to the received input data block includes (1) selecting a generic code sequence in response to a first portion of the input data block, the generic code sequence pointing to a set of elemental length components; (2) selecting a sequence of elemental length components from the set of elemental length components in response to a second portion of the input data block; and (3) appending a third portion of the input data block to the selected sequence of elemental length component to generate the codeword.

This invention can also be regarded as a method for encoding a sequence of input data blocks into a sequence of codewords. The method includes receiving the sequence of input data blocks and generating the sequence of codewords responsive to the received sequence of input data blocks. The step of generating the sequence of codewords includes generating a codeword for each input data block. In accordance with a feature of the invention, the method includes the step of concatenating the generated codewords to form the sequence of codewords, the sequence of codewords having a constraint on the maximum run length of bits between occurrences of the influential pattern. In accordance with another feature of the invention, the maximum run length of bits is less than or equal to the second predetermined number of bits.

This invention can also be regarded as a method for operating a read channel in a storage system having a storage media and a read transducer. The method includes operating the read transducer to generate a sequence of code bits recorded on the storage media. The method includes operating a circuit to generate a sequence of codewords derived from the sequence of code bits. Each of the codewords has a predetermined number of bits. The sequence of codewords has constraint on the maximum run length of bits between occurrences of a predetermined influential pattern, the maximum run length being less than or equal to the predetermined number of bits. The occurrence of the influential pattern substantially influences the performance of the circuit. A decoder operates to convert the sequence of codewords into a corresponding sequence of input data blocks.

This invention can also be regarded as an apparatus for encoding an input data block into a codeword, the apparatus being a part of a sampled data channel in a storage system. The data channel includes a circuit the performance of which is adversely affected by an excessive run length of bits between occurrences of a predetermined influential pattern. The apparatus includes means for receiving the input data block and means for generating the codeword responsive to the received input data block. The codeword has a constraint on the maximum run length of bits between occurrences of the influential pattern.

In accordance with a feature of the invention, the means for generating the codeword responsive to the received input data block includes (1) means for selecting a generic code sequence in response to a first portion of the input data block, the generic code sequence pointing to a set of elemental length components; (2) means for selecting a sequence of elemental length components from the set of elemental length components in response to a second portion of the input data block; and (3) means for appending a third portion of the input data block to the selected sequence of elemental length component to generate the codeword.

This invention can also be regarded as an apparatus for encoding a sequence of input data blocks into a sequence of codewords. The apparatus includes means for receiving the sequence of input data blocks and means for generating the sequence of codewords responsive to the received sequence of input data blocks. The sequence of codewords has a constraint on the maximum run length of bits between occurrences of the influential pattern, the maximum run length of bits being less than or equal to the second predetermined number of bits.

The foregoing and other features of the invention are described in detail below and set forth in the appended claims.

DESCRIPTION OF THE PREFERRED EMBODIMENTS

Figure 1:
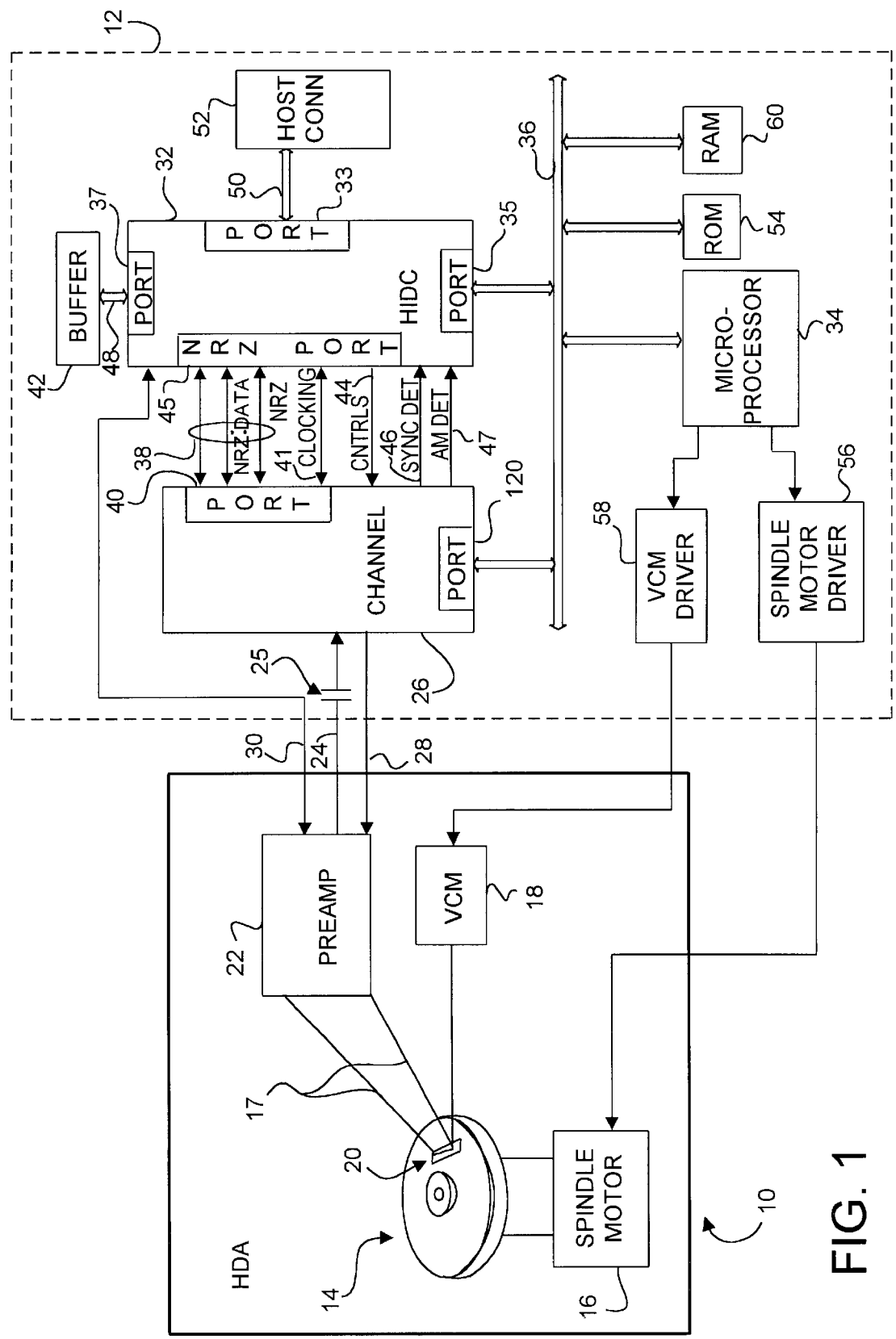
FIG. 1 is a block diagram of a disk drive embodying the invention.

Referring to FIG. 1, a hard disk drive in accordance with a preferred embodiment of the invention includes a head disk assembly ("HDA 10") and a printed circuit board assembly ("PCBA 12"). PCBA 12 includes a host interface and disk controller ("HIDC 32") and a channel 26. Channel 26 participates in the transfer of data bits between HIDC 32 and HDA 10. Preferably, channel 26 is an element of a write/read system which incorporates partial response signaling such as PR4ML, EPR4ML, and $E^2PRML$ signaling methods.

The disclosure of commonly owned co-pending U.S. patent application Ser. No. 08/815,932, filed Mar. 11, 1997, entitled DISK DRIVE EMPLOYING READ ERROR TOLERANT SYNC MARK DETECTION, is incorporated herein by reference (the "incorporated application"). A description of the elements shown in FIG. I is set forth in the incorporated application.

Figure 2:
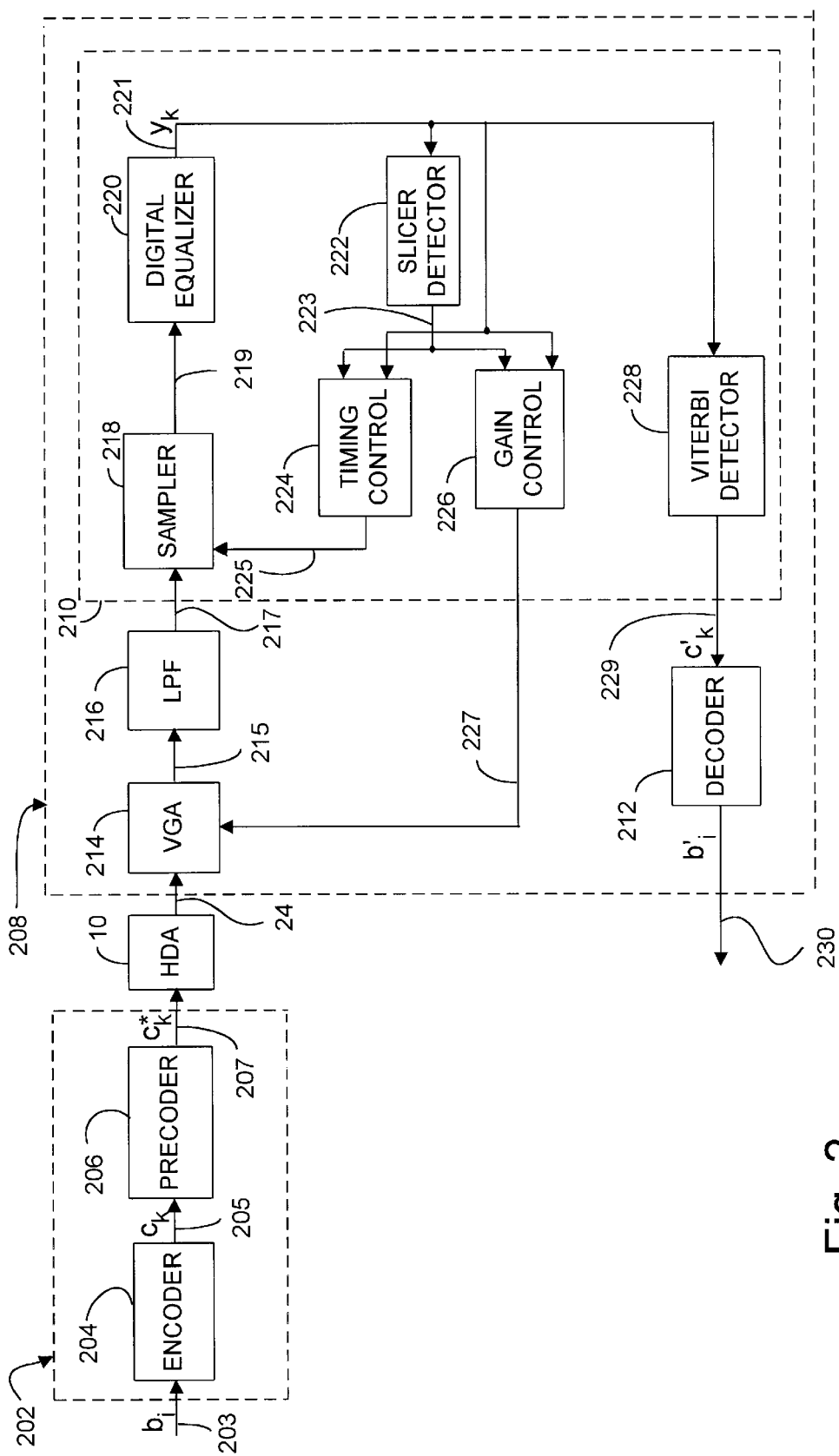
FIG. 2 is a block diagram of a write/read system for the disk drive of FIG. 1 according to an embodiment of the invention.

Referring to FIG. 2, channel 26 (FIG. 1) includes a write channel 202 and a read channel 208. Write channel 202 includes an encoder 204 and a precoder 206. Read channel 208 includes a variable gain amplifier ("VGA 214"), a low pass filter ("LPF 216"), sampled data detection system 210 and a decoder 212. Sampled data detection system 210 includes a sampler 218, a digital equalizer 220, a slicer detector 222, a timing control 224, a gain control 226, and a Viterbi detector 228.

Figure 3A:
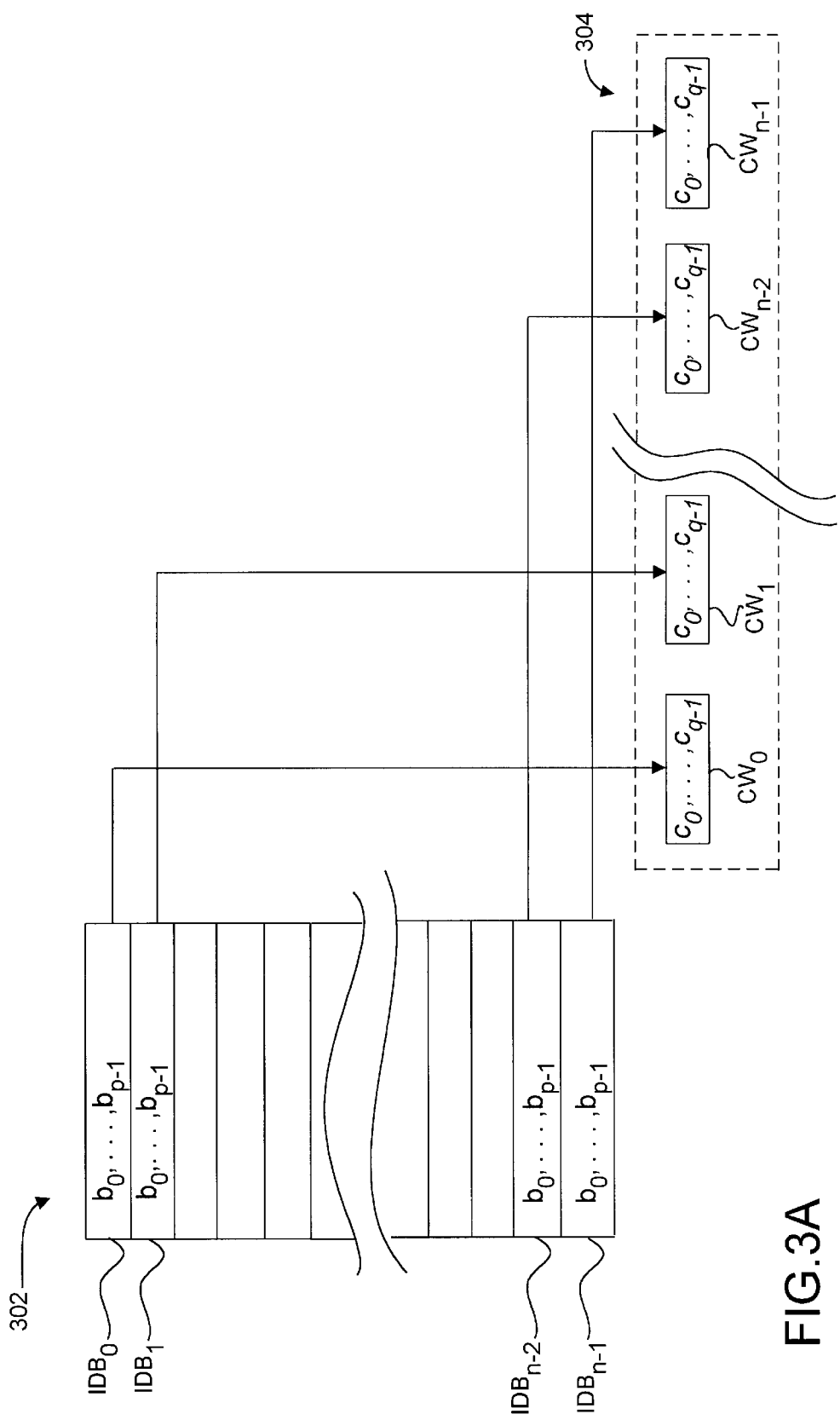
FIG. 3A is a diagram showing a sequence of input data blocks $IDB_0$–$IDB_{n-1}$ and a corresponding concatenated sequence of codewords $CW_0$–$CW_{n-1}$ generated in accordance with an embodiment of the invention.

Referring to FIG. 3A, a sequence of input data blocks 302 comprises n input data blocks $IDB_0$–$IDB_{n-1}$ and a sequence of codewords 304 comprises n codewords $CW_0$–$CW_{n-1}$. Each input data block $IDB_0$–$IDB_{n-1}$ includes a sequence of p input data bits $b_0, \ldots, b_{p-1}$ wherein each input data bit $b_i$ in the sequence of input data bits is referenced by the bit position number i. More specifically, each input data bit may also be referenced by the bit position $b_{j,i}$ where j is the input data block number and i is the input data bit position number in the sequence of input data bits. Each codeword $CW_0$–$CW_{n-1}$ includes a sequence of q code bits $c_0, \ldots, c_{q-1}$ wherein each code bit $c_k$ in the sequence of code bits is referenced by the bit position number k. More specifically, each code bit may be referenced by the code bit position $c_{j,k}$ where j is the codeword number and k is the code bit position number in the sequence of code bits.

During a write operation, encoder 204 (FIG. 2) receives an input signal 203 defining the sequence of input data bits $b_i$ for each input data block $IDB_0$–$IDB_{n-1}$ received from HIDC 32 (FIG. 1) and generates an output signal 205 defining the sequence of code bits $c_k$ for each codeword $CW_0$–$CW_{n-1}$. Encoder 204 receives its input signal as a serial by block, parallel by bit signal and its output signal is a serial by bit signal. Precoder 206 receives the sequence of code bits $c_k$ for each codeword $CW_0$–$CW_{n-1}$ and generates a sequence of code bits $c^*_k$ modified by a predetermined transfer function. For a channel 26 incorporating PR4ML signaling methods, the transfer function is $1/(1 \oplus D^2)$ such that the output of precoder 206 ($c^*_k$) equals $c^*_{k-2}$ xor $c_k$.

During a read operation, VGA 214 (FIG. 2) receives analog signal 24 and under control of gain control 226 produces an analog signal 215 that has a substantially constant amplitude. LPF 216 receives analog signal 215 and generates analog signal 217 having an improved signal to noise ratio. Sampled data detection system 210 receives analog signal 217 and performs signal processing to produce an output signal 229 that defines a sequence of code bits $c'_k$ which in the absence of error corresponds to the sequence of code bits $c_k$.

Sampler 218 receives analog signal 217 and in response generates digital signal 219. Analog signal 217 is sampled at a channel rate of 1/T, where T is the duration of a code bit. Digital equalizer 220 receives digital signal 219 and generates an equalized digital signal 221 ($y_k$) which is equalized to satisfy a predetermined channel transfer polynomial. For a channel 26 incorporating the PR4ML signaling method, the channel transfer polynomial is $(1-D^2)$, where D represents a unit-time delay operator with unit-time T and the equalized sample value for equalized digital signal 221 ($y_k$) has one of three possible target values (+1,0,−1). The target value for digital signal 221 ($y_k$) corresponds to the equation $c^*_k - c^*_{k-2}$.

Slicer detector 222 receives equalized digital signal 221 ($y_k$) and in response generates (for the PR4ML channel) a slicer digital signal 223 ($a_k$) having one of three possible slicer sample values (+1,0,−1). Slicer digital signal 223 ($a_k$) is a coarsely quantized estimate of equalized digital signal 221 ($y_k$). If the equalized sample value for equalized digital signal 221 ($y_k$) is greater than a first predetermined factor (e.g., ½) of the target value +1, the slicer sample value is +1. If the equalized sample value for equalized digital signal 221 ($y_k$) is less than a second predetermined factor (e.g., ½) of the target value −1, the slicer sample value is −1. If the equalized sample value for equalized digital signal 221 ($y_k$) is between (a) the first predetermined factor (e.g., ½) of the target value +1 and (b) the second predetermined factor (e.g., ½) of the target value −1, than the slicer sample value is 0.

Timing control 224 receives equalized digital signal 221 and slicer digital signal 223 and generates a read (sample) clock signal 225 for sampling analog signal 217 at desired locations. Gain control 226 receives equalized digital signal 221 and slicer digital signal 223 and generates a gain control signal 227 to maintain analog signal 215 at a substantially constant amplitude.

Timing control 224 maintains (aligns) read clock signal 225 so that analog signal 217 continues to be sampled at the desired locations. Timing control 224 includes circuitry for producing an error-estimating signal that has a magnitude determined by the following equation: $e_\tau(k) = a_k y_{k-1} - a_{k-1} y_k$. The term $e_\tau(k)$ is the magnitude of the error-estimating signal at sample k.

The timing error-estimating equation $e_\tau(k) = a_k y_{k-1} - a_{k-1} y_k$ includes timing correction information received from the previous and current samples values for equalized digital signal 221 ($y_{k-1}$ and $y_k$) and slicer digital signal 223 ($a_{k-1}$ and $a_k$). A pair of adjacent slicer digital signals 223 ($a_{k-1}$ and $a_k$) having non-zero slicer sample values provides superior timing correction information for the timing error-estimating equation. In contrast, a pair of adjacent slicer digital signals 223 ($a_{k-1}$ and $a_k$) having only one non-zero slicer sample value provides inferior timing correction information for the timing error-estimating equation. No timing correction information is available for the timing error-estimating equation when a pair of adjacent slicer digital signals 223 ($a_{k-1}$ and $a_k$) each have zero slicer sample values.

Sampled data detection system 210 is adversely affected by an excessive run length of bits between occurrences of an influential pattern. The influential pattern includes a multibit sequence suitable for providing sampled data detection system 210 with superior timing correction information. An excessive run length of bits between occurrences of the influential pattern can result in mispositioning of sample timing and create difficulties in Viterbi detector 228.

To improve the timing recovery (timing control 224) in sampled data detection system 210, a constraint $n_{max}$ is placed on the maximum run length of code bits ($c_k$) between occurrences of the influential pattern. According to an embodiment of the invention, the maximum run length of bits is less than or equal to the number of bits q in a codeword. Preferably, the influential pattern is a pair of adjacent binary ones. With respect to the (0,G/I) constraint, the constraint G is less than or equal to $n_{max}$ and the constraint I is less than or equal to ½($n_{max}$+1).

The following tables A–D illustrate corresponding binary and noiseless sample values for bit positions progressing through encoder 204, precoder 206, digital equalizer 220 and slicer detector 222. As shown in tables A–D, precoder 206 includes previous precoded bits $c^*_{k-3}$ and $c^*_{k-2}$ equal to 00, 01, 10, or 11. If the previous and current code bits ($c_{k-1}$ and $c_k$) each have a binary value of one (a pair of adjacent binary ones), the previous and current slicer digital signal 223 ($a_{k-1}$ and $a_k$) will each have a non-zero slicer sample value (a pair of adjacent non-zero slicer sample values). If the previous and current code bits ($c_{k-1}$ or $c_{k-1}$) each have a binary value of 0, the previous and current slicer digital signal 223 ($a_{k-1}$ and $a_k$) will each have slicer sample value of 0. If either the previous or current code bit ($c_{k-1}$ or $c_{k-1}$) has a binary value of 0, the previous or current slicer digital signal 223 ($a_{k-1}$ or $a_k$) will have a slicer sample value of 0.

TABLE A

| | | $c^*_k = c^*_{k-2}$ xor $c_k$ | | | | $y_k = c^*_k - c^*_{k-2}$ | | Slicer Detector | |
|---|---|---|---|---|---|---|---|---|---|
| $c_{k-1}$ | $c_k$ | $c^*_{k-3}$ | $c^*_{k-2}$ | $c^*_{k-1}$ | $c^*_k$ | $y_{k-1}$ | $y_k$ | $a_{k-1}$ | $a_k$ |
| 0 | 0 | 0 | 0 | 0 | 0 | 0 | 0 | 0 | 0 |
| 0 | 1 | 0 | 0 | 0 | 1 | 0 | +1 | 0 | +1 |
| 1 | 0 | 0 | 0 | 1 | 0 | +1 | 0 | +1 | 0 |
| 1 | 1 | 0 | 0 | 1 | 1 | +1 | +1 | +1 | +1 |

TABLE B

| | | $c^*_k = c^*_{k-2}$ xor $c_k$ | | | | $y_k = c^*_k - c^*_{k-2}$ | | Slicer Detector | |
|---|---|---|---|---|---|---|---|---|---|
| $c_{k-1}$ | $c_k$ | $c^*_{k-3}$ | $c^*_{k-2}$ | $c^*_{k-1}$ | $c^*_k$ | $y_{k-1}$ | $y_k$ | $a_{k-1}$ | $a_k$ |
| 0 | 0 | 0 | 1 | 0 | 1 | 0 | 0 | 0 | 0 |
| 0 | 1 | 0 | 1 | 0 | 0 | 0 | −1 | 0 | −1 |
| 1 | 0 | 0 | 1 | 1 | 1 | +1 | 0 | +1 | 0 |
| 1 | 1 | 0 | 1 | 1 | 0 | +1 | −1 | +1 | −1 |

TABLE C

| | | $c^*_k = c^*_{k-2}$ xor $c_k$ | | | | $y_k = c^*_k - c^*_{k-2}$ | | Slicer Detector | |
|---|---|---|---|---|---|---|---|---|---|
| $c_{k-1}$ | $c_k$ | $c^*_{k-3}$ | $c^*_{k-2}$ | $c^*_{k-1}$ | $c^*_k$ | $y_{k-1}$ | $y_k$ | $a_{k-1}$ | $a_k$ |
| 0 | 0 | 1 | 0 | 1 | 0 | 0 | 0 | 0 | 0 |
| 0 | 1 | 1 | 0 | 1 | 1 | 0 | +1 | 0 | +1 |
| 1 | 0 | 1 | 0 | 0 | 0 | −1 | 0 | −1 | 0 |
| 1 | 1 | 1 | 0 | 0 | 1 | −1 | +1 | −1 | +1 |

TABLE D

| | | $c^*_k = c^*_{k-2}$ xor $c_k$ | | | | $y_k = c^*_k - c^*_{k-2}$ | | Slicer Detector | |
|---|---|---|---|---|---|---|---|---|---|
| $c_{k-1}$ | $c_k$ | $c^*_{k-3}$ | $c^*_{k-2}$ | $c^*_{k-1}$ | $c^*_k$ | $y_{k-1}$ | $y_k$ | $a_{k-1}$ | $a_k$ |
| 0 | 0 | 1 | 1 | 1 | 1 | 0 | 0 | 0 | 0 |
| 0 | 1 | 1 | 1 | 1 | 0 | 0 | −1 | 0 | −1 |
| 1 | 0 | 1 | 1 | 0 | 1 | −1 | 0 | −1 | 0 |
| 1 | 1 | 1 | 1 | 0 | 0 | −1 | −1 | −1 | −1 | has a binary value of 0, the previous or current slicer digital signal 223 ($a_{k-1}$ or $a_k$) will have a slicer sample value of 0.

Figure 3B:
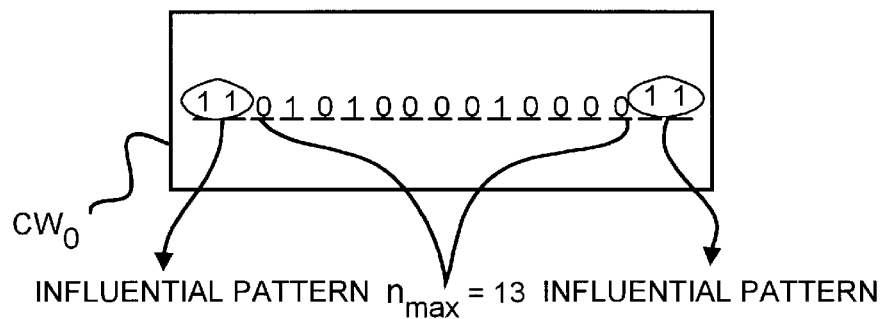
FIG. 3B is a diagram illustrating a codeword $CW_0$ generated in accordance with an embodiment of the invention in which the codeword includes two occurrences of the influential pattern and the run length between occurrences of the influential pattern is the maximum number allowed under an $n_{max}$ constraint of 13 bits.

Referring to FIG. 3B, codeword $CW_0$ is generated in accordance with an embodiment of the invention in which each generated codeword includes two influential patterns, the influential pattern containing a pair of adjacent binary ones. As shown in FIG. 3B, the run length between occurrences of the influential pattern is the maximum number allowed under an $n_{max}$ constraint of 13 bits. Preferably, this embodiment includes one or more lookup tables for generating a sequence of codewords $CW_0$ and $CW_{n-1}$ whereby the $n_{max}$ constraint is imposed on each generated codeword.

Figure 3C:
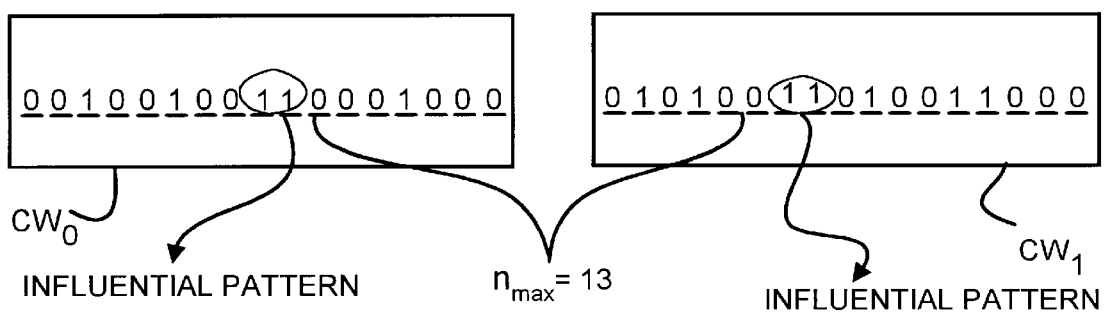
FIG. 3C is a diagram illustrating two concatenated codewords $CW_0$ and $CW_1$ generated in accordance with another embodiment of the invention in which an influential pattern occurs in each codeword and the run length between occurrences of the influential pattern is the maximum number allowed under an $n_{max}$ constraint of 13 bits.

Referring to FIG. 3C, two concatenated codewords $CW_0$ and $CW_1$ are generated in accordance with another embodiment of the invention in which each generated codeword includes at least one influential pattern, the influential pattern containing a pair of adjacent binary ones. As shown in FIG. 3C, the run length between occurrences of the influential pattern is the maximum number allowed under an $n_{max}$ constraint of 13 bits. Preferably, this embodiment of the invention includes one or more lookup tables for generating a sequence of codewords $CW_0$ and $CW_{n-1}$ whereby the $n_{max}$ constraint is imposed on the sequence of generated codewords.

Referring to FIG. 2, Viterbi detector 228 receives equalized digital read signal 221 ($y_k$) and generates digital signal 229 ($c_k$). Digital signal 229 is a serial by bit signal which in the absence of error corresponds to the output sequence of encoder 204. Decoder 212 receives the sequence of code bits $c'_k$ and generates a corresponding sequence of input data bits $b'_i$. The output of decoder 212 has the form of serial by block, parallel by bit which in the absence of error corresponds to the input sequence to encoder 204.

A method of operating read channel 208 includes operating read transducer 20 to generate a sequence of code bits recorded on the storage media 14. The method includes operating sampled data detection system 210 to generate a sequence of codewords $CW'_0$–$CW'_{n-1}$ derived from the sequence of code bits. Each codeword has a predetermined number of bits q. The sequence of codewords has a maximum run length of bits between occurrences of a predetermined influential pattern, the maximum run length being less than or equal to the predetermined number of bits q. The occurrence of the influential pattern substantially influences the performance of sampled data detection system 210. Decoder 212 operates to convert the sequence of codewords $CW'_0$–$CW'_{n-1}$ into a corresponding sequence of input data blocks $IBD'_0$–$IBD'_{n-1}$.

The $n_{max}$ constraint on the maximum run length of bits between occurrence of the influential pattern allows more robustness with respect to disk drive impediments (e.g., intersymbol interference, signal to noise ratio, misequalization) and enables increased areal bit densities. For example, the $n_{max}$ constraint on the sequence of code bits improves timing recovery in sampled data detection system 210 by limiting the run length of code bits between occurrences of superior timing correction. Also, the n constraint constrains the interleaved sequence of bits to improve the performance of Viterbi detector 228.

Figure 4:
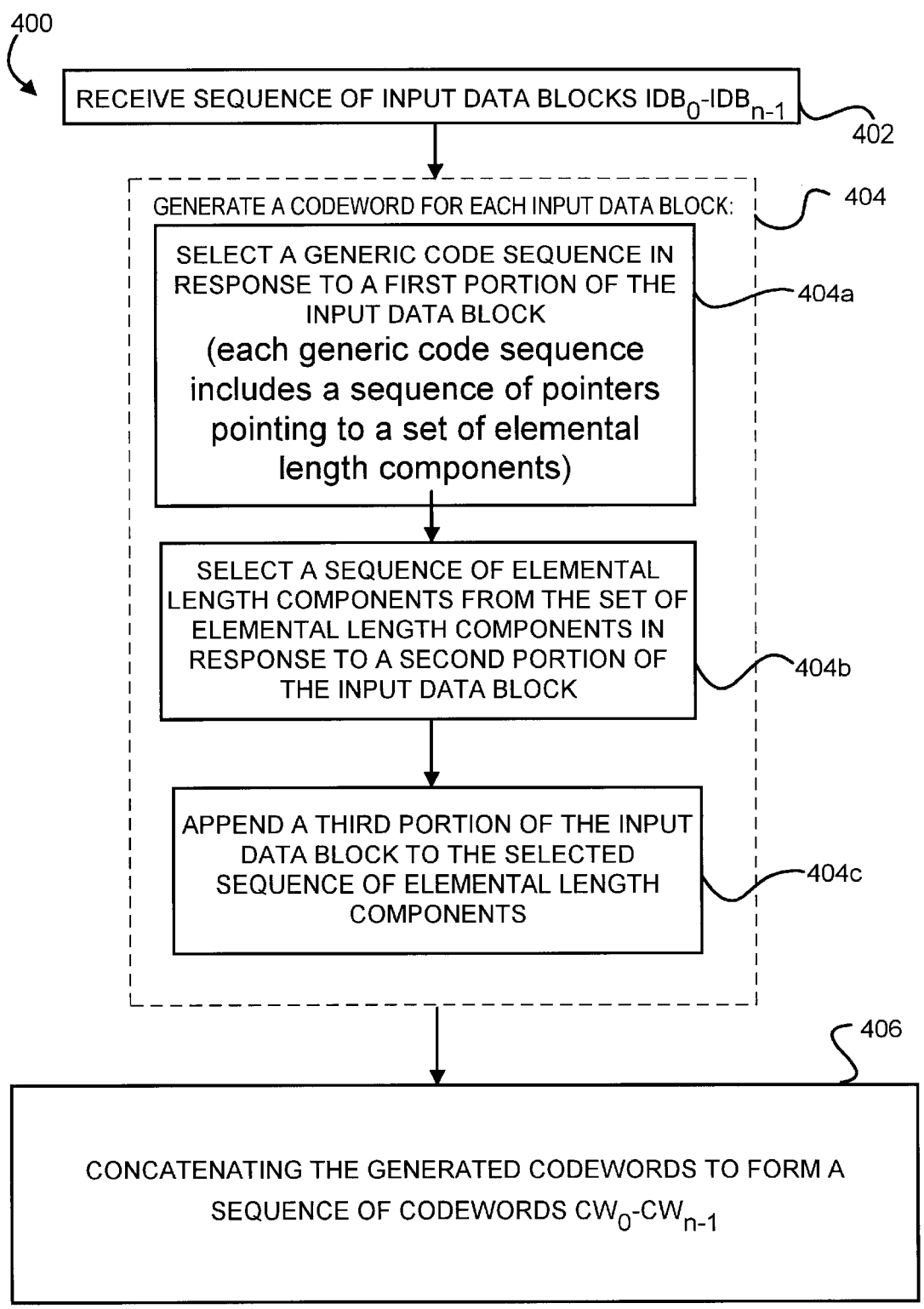
FIG. 4 is a flow chart describing process steps for encoding a sequence of input data blocks into a sequence of codewords according to an embodiment of the invention.

Referring to FIG. 4, process flow 400 includes an encoding step 402 for receiving a sequence of input data blocks $IDB_0$–$IDB_{n-1}$; encoding step 404 for generating a codeword for each input data block; and encoding step 406 for concatenating the generated codewords to form a sequence of codewords $CW_0$–$CW_{n-1}$.

Each input data block includes a first predetermined number of bits p and each codeword includes a second predetermined number of bits q. Preferably, the ratio of input data bits p to codeword bits q is greater than ¾. The generated sequence of codewords $CW_0$–$CW_{n-1}$ has a constraint on the maximum run length of bits between occurrences of the influential pattern, the maximum run length of bits being less than or equal to the second predetermined number of bits q.

Encoding step 404 includes steps 404a, 404b, and 404c. Encoding step 404a includes selecting a generic code sequence in response to a first portion of the input data block. Each generic code sequence includes a sequence of pointers pointing to a set of elemental length components. Encoding step 404b includes selecting a sequence of elemental length components from the set of elemental length components in response to a second portion of the received input data block. Encoding step 404c includes appending a third portion of the input data block to the selected sequence of elemental length components to generate the codeword. Each generated codeword includes a major component and a minor component. The selected sequence of elemental length components is the major component of the codeword. The uncoded portion of the input data block is the minor component. The input data block includes predetermined bit positions which are allocated to the first portion, the second portion, and the third portion of the input data block. For example, consecutive or non-consecutive bit positions can be allocated to the first, second, and third portions of the input data block.

Table 2 is an example of a set of elemental length components according to an embodiment of the invention. Preferably, each elemental length component is a four bit binary sequence. The set of elemental length components includes a subset of inferior elemental length components and a subset of superior elemental length components. The subset of inferior elemental length components includes a subset A1 of inferior elemental length components and a subset A2 of inferior elemental length components. The subset of superior elemental length components includes a subset B of superior elemental length components and a subset C of superior elemental length components. Subsets B and C each include elemental length components containing an influential pattern.

As set forth in table 2, pointer A1 points to four elemental length components: 0000, 0001, 0010, 0100; pointer A2 points to four elemental length components: 0101, 1000, 1001, 1010; pointer B points to four elemental length components: 0110, 1100, 1101, 1110; and pointer C points to four elemental length components: 0011, 0111, 1011, 1111.

Preferably, an 8/9 code rate encoder includes generating a major component having two elemental length components; a 16/17 code rate encoder includes generating a major component having four elemental length components; a 24/25 code rate encoder includes generating a major component having six elemental length components; a 32/33 code rate encoder includes generating a major component having eight elemental length components.

According to an embodiment of the invention where the $n_{max}$ constraint is imposed on each codeword (FIG. 3B), the major component of each codeword includes at least two superior elemental length components. According to another embodiment of the invention where the no constraint is imposed on a sequence of codewords (FIG. 3C; e.g., string of code bits without regard to the codeword boundaries), the major component of each codeword includes at least one superior elemental length component. Preferably, the $n_{max}$ constraint is imposed on a sequence of codewords wherein the major component of each codeword includes at least two superior elemental length components.

Examples of encoding an input data block into a corresponding codeword

Figure 5:
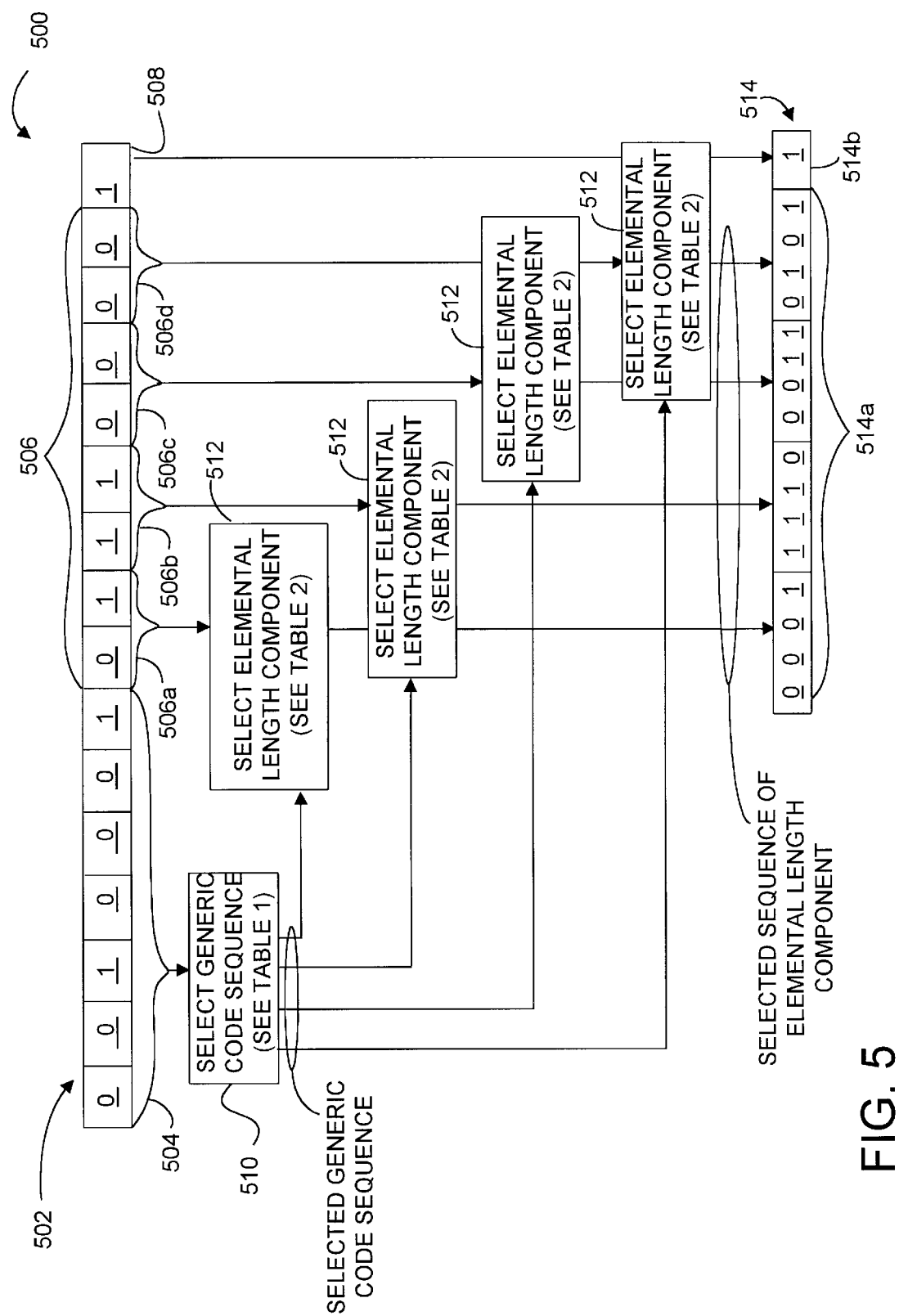
FIG. 5 is a diagram illustrating a process for encoding a 16 bit input data block into a 17 bit codeword according to an embodiment of the invention.

Referring to FIG. 5, process flow 500 illustrates a process according to an embodiment of the invention for receiving a 16 bit ($b_0$, ..., $b_{15}$) input data block 502 and generating a 17 bit ($c_0$, ..., $C_{16}$) codeword 514. Input data block 502 is partitioned into a first portion 504 containing a 7-bit address location, a second portion 506 containing four 2-bit address locations 506a–506d, and a third portion 508 containing an uncoded bit.

First portion 504 selects a generic code sequence having pointers $P_1P_2P_3P_4$ from table 1 (510), the selected generic code sequence pointing to a set of elemental length components in table 2. Second portion 506 is associated with the selected generic code sequence pointers $P_1P_2P_3P_4$ to select a sequence of elemental length components from table 2 (512). Third portion 508 is appended to the selected sequence of elemental length components to generate codeword 514.

Table 1 (510) includes 128 decimal value addresses and corresponding generic code sequences. Table 2 (512) includes a set of elemental length components having a subset of inferior elemental length components and a subset of superior elemental length components.

Each pointer in the generic code sequence $P_1P_2P_3P_4$ points to either subset A1 of inferior elemental length components, subset A2 of inferior elemental length components, subset B of superior elemental length components, or subset C of superior elemental length components. As shown in table 1 (510), each of the 128 different generic code sequences includes at least two pointers pointing to subsets B and C of superior elemental length components.

0010001 (decimal value=17) for selecting from table 1 (510) the generic code sequence having pointers A1 B C A2. Each pointer points to a set of elemental length components in table 2 (512).

Second portion 506 includes four 2-bit binary addresses 01 (506a), 11 (506b), 00 (506c), and 00 (506d) for selecting from table 2 (512) an elemental length component for each subset included in the selected generic codes sequence A1 B C A2. As shown in FIG. 5 and with reference to table 2

TABLE 1

GENERIC CODE SEQUENCES

| DECIMAL VALUE OF FIRST PORTION 504 | GENERIC CODE SEQUENCE $P_1P_2P_3P_4$ | DECIMAL VALUE OF FIRST PORTION 504 | GENERIC CODE SEQUENCE $P_1P_2P_3P_4$ | DECIMAL VALUE OF FIRST PORTION 504 | GENERIC CODE SEQUENCE $P_1P_2P_3P_4$ | DECIMAL VALUE OF FIRST PORTION 504 | GENERIC CODE SEQUENCE $P_1P_2P_3P_4$ |
|---|---|---|---|---|---|---|---|
| 0 | A1 B A1 B | 32 | B A1 A1 B | 64 | B B C A1 | 96 | C A1 C A1 |
| 1 | A1 B A2 B | 33 | B A1 A2 B | 65 | B B C A2 | 97 | C A1 C A2 |
| 2 | A2 B A1 B | 34 | B A2 A1 B | 66 | B B C B | 98 | C A2 C A1 |
| 3 | A2 B A2 B | 35 | B A2 A2 B | 67 | B B C C | 99 | C A2 C A2 |
| 4 | A1 B A1 C | 36 | B A1 A1 C | 68 | B C A1 B | 100 | C A1 C B |
| 5 | A1 B A2 C | 37 | B A1 A2 C | 69 | B C A2 B | 101 | C A2 C B |
| 6 | A2 B A1 C | 38 | B A2 A1 C | 70 | B C A1 C | 102 | C A1 C C |
| 7 | A2 B A2 C | 39 | B A2 A2 C | 71 | B C A2 C | 103 | C A2 C C |
| 8 | A1 B B A1 | 40 | B A1 B A1 | 72 | B C B A1 | 104 | C B A1 B |
| 9 | A1 B B A2 | 41 | B A1 B A2 | 73 | B C B A2 | 105 | C B A2 B |
| 10 | A2 B B A1 | 42 | B A2 B A1 | 74 | B C B B | 106 | C B A1 C |
| 11 | A2 B B A2 | 43 | B A2 B A2 | 75 | B C B C | 107 | C B A2 C |
| 12 | A1 B B B | 44 | B A1 B B | 76 | B C C A1 | 108 | C B B A1 |
| 13 | A2 B B B | 45 | B A2 B B | 77 | B C C A2 | 109 | C B B A2 |
| 14 | A1 B B C | 46 | B A1 B C | 78 | B C C B | 110 | C B B B |
| 15 | A2 B B C | 47 | B A2 B C | 79 | B C C C | 111 | C B B C |
| 16 | A1 B C A1 | 48 | B A1 C A1 | 80 | C A1 A1 B | 112 | C B C A1 |
| 17 | A1 B C A2 | 49 | B A1 C A2 | 81 | C A1 A2 B | 113 | C B C A2 |
| 18 | A2 B C A1 | 50 | B A2 C A1 | 82 | C A2 A1 B | 114 | C B C B |
| 19 | A2 B C A2 | 51 | B A2 C A2 | 83 | C A2 A2 B | 115 | C B C C |
| 20 | A1 B C B | 52 | B A1 C B | 84 | C A1 A1 C | 116 | C C A1 B |
| 21 | A2 B C B | 53 | B A2 C B | 85 | C A1 A2 C | 117 | C C A2 B |
| 22 | A1 B C C | 54 | B A1 C C | 86 | C A2 A1 C | 118 | C C A1 C |
| 23 | A2 B C C | 55 | B A2 C C | 87 | C A2 A2 C | 119 | C C A2 C |
| 24 | A1 C C A1 | 56 | B B A1 B | 88 | C A1 B A1 | 120 | C C B A1 |
| 25 | A1 C C A2 | 57 | B B A2 B | 89 | C A1 B A2 | 121 | C C B A2 |
| 26 | A2 C C A1 | 58 | B B A1 C | 90 | C A2 B A1 | 122 | C C B B |
| 27 | A2 C C A2 | 59 | B B A2 C | 91 | C A2 B A2 | 123 | C C B C |
| 28 | A1 C C B | 60 | B B B A1 | 92 | C A1 B B | 124 | C C C A1 |
| 29 | A2 C C B | 61 | B B B A2 | 93 | C A2 B B | 125 | C C C A2 |
| 30 | A1 C C C | 62 | B B B B | 94 | C A1 B C | 126 | C C C B |
| 31 | A2 C C C | 63 | B B B C | 95 | C A2 B C | 127 | C C C C |

TABLE 2

SET OF ELEMENTAL LENGTH COMPONENTS

| ADDRESS | SUBSET OF INFERIOR ELEMENTAL LENGTH COMPONENTS | | SUBSET OF SUPERIOR ELEMENTAL LENGTH COMPONENTS | |
|---|---|---|---|---|
| | SUBSET A1 OF INFERIOR ELEMENTAL LENGTH COMPONENTS (SUBSET A1) | SUBSET A2 OF INFERIOR ELEMENTAL LENGTH COMPONENTS (SUBSET A2) | SUBSET B OF SUPERIOR ELEMENTAL LENGTH COMPONENTS (SUBSET B) | SUBSET C OF SUPERIOR ELEMENTAL LENGTH COMPONENTS (SUBSET C) |
| 00 | 0000 | 0101 | 0110 | 0011 |
| 01 | 0001 | 1000 | 1100 | 0111 |
| 10 | 0010 | 1001 | 1101 | 1011 |
| 11 | 0100 | 1010 | 1110 | 1111 |

For example, process flow 500 includes receiving an input data block 502 having input data sequence 0010001011100001. First portion 504 includes 7 bit address (512), subset A1 of inferior elemental length components is associated with the 2-bit binary address 01 (506a) to select the elemental length component 0001; subset B of inferior elemental length components is associated with the 2-bit binary address 11 (506b) to select the elemental length component 1110; subset C of superior elemental length components is associated with the 2-bit binary address 00 (506c) to select the elemental length component 0011; subset A2 of inferior elemental length components is associated with the 2-bit binary address 00 (506d) to select the elemental length component 0101. The selected sequence of elemental length components is 0001 1110 0011 0101. Major component 514a includes the selected sequence of elemental length components.

Third portion 508 includes an uncoded bit having a binary value of 1. Third portion 508 corresponds to minor component 514b and is appended to major component 514a to generate the 17 bit codeword 0001 1110 0011 0101 1.

Figure 6:
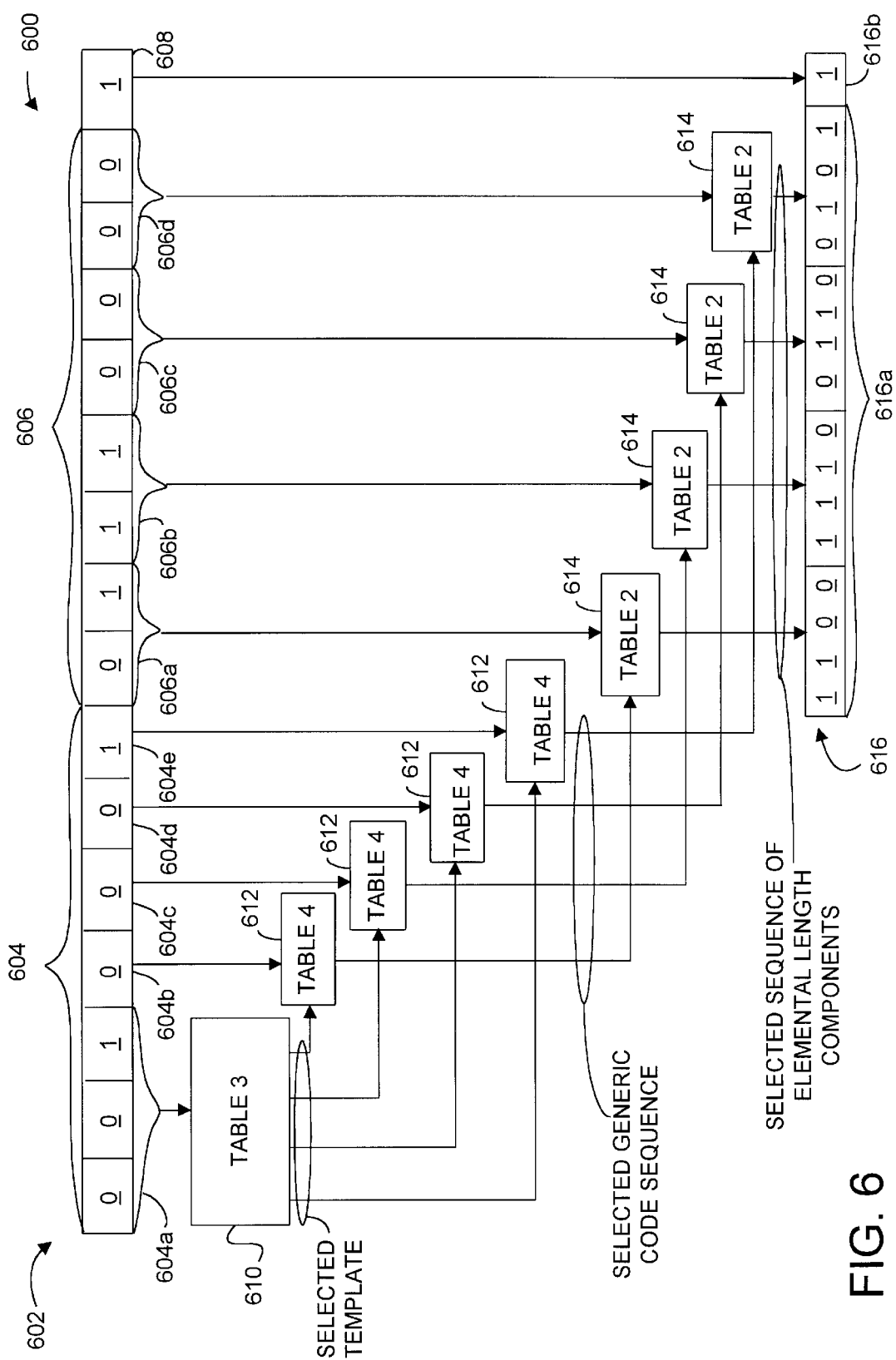
FIG. 6 is a diagram illustrating a process for encoding a 16 bit input data block into a 17 bit codeword according to another embodiment of the invention.

Referring to FIG. 6, process flow 600 illustrates a process according to another embodiment of the invention for receiving a 16 bit ($b_0, \ldots, b_{15}$) input data block 602 and generating a 17 bit ($c_0, \ldots, c_{16}$) codeword 616. Input data block 602 is partitioned into a first portion 604 containing address locations 604a–604e, a second portion 606 containing four 2-bit address locations 606a–606d, and a third portion 608 containing an uncoded bit.

First portion 604a selects a template having a sequence of pointers $P^*_1 P^*_2 P^*_3 P^*_4$ from table 3 (610), the selected template pointing to a subset of elemental length components in table 4 (612). First portion 604b–604e is associated with the selected template pointers $P^*_1 P^*_2 P^*_3 P^*_4$ to select a sequence of subsets of elemental length components from table 4 (612). The selected sequence of subsets of elemental length components corresponds to a generic code sequence having pointers $P_1 P_2 P_3 P_4$ pointing to the set of elemental length components in table 2 (614).

Second portion 606 is associated with the selected generic code sequence $P_1 P_2 P_3 P_4$ to select a sequence of elemental length components from table 2 (614). Third portion 608 is appended to the selected sequence of elemental length components to generate codeword 616.

Table 3 (610) includes 7 different decimal value addresses and corresponding templates, each template having a sequence of pointers $P^*_1 P^*_2 P^*_3 P^*_4$ pointing to the subset of elemental length components in table 4 (612). The subset of elemental length components in table 4 (612) includes subset G of superior elemental length components and subset H of inferior elemental length components in table 2. Subset G of superior elemental length components includes the subsets B and C of superior elemental length components. Subset H of inferior elemental length components includes the subsets A1 and A2 of inferior elemental length components.

TABLE 3

| DECIMAL VALUE OF FIRST PORTION 604a | TEMPLATE $P^*_1 P^*_2 P^*_3 P^*_4$ |
| --- | --- |
| 0 | GGGG |
| 1 | GGGH |
| 2 | GGHG |
| 3 | GHGG |
| 4 | GHGH |
| 5 | GHHG |
| 6 | HGGG |
| 7 | HGGH |

TABLE 4

SUBSET OF ELEMENTAL LENGTH COMPONENTS

| ADDRESS | SUBSET G OF SUPERIOR ELEMENTAL LENGTH COMPONENTS (SUBSET G) | SUBSET H OF INFERIOR ELEMENTAL LENGTH COMPONENTS (SUBSET H) |
| --- | --- | --- |
| 0 | subset B | subset A1 |
| 1 | subset C | subset A2 |

For example, process flow 600 includes receiving an input data block 602 having input data sequence 0010001011100001. First portion 604a includes s 3 bit address 001 (decimal value=1 for selecting from table 3 (610) the template having pointers G G G H. Each pointer points to the subset of elemental length components in table 4 (612).

First portion 604b–604e includes four 1-bit addresses 0 (604b), 0 (604c), 0 (604d), and 1 (604e) for selecting from table 4 a subset (A1, A2, B or C) of elemental length components for each subset in the selected template G G G H. As shown in FIG. 6 and with reference to table 4 (612), template pointer G is associated with the 1-bit binary address 0 (604b) to select subset B of superior elemental length components; template pointer G is associated with the 1-bit binary address 0 (604c) to select subset B of superior elemental length components; template pointer G is associated with the 1-bit binary address 0 (604d) to select subset B of superior elemental length components; template pointer H is associated with the 1-bit binary address 1 (604e) to select subset member A2 of inferior elemental length components. The selected sequence of subsets B B B A2 corresponds to the generic code sequence B B B A2.

Second portion 606a–606d includes four 2-bit binary addresses 01 (606a), 11 (606b), 00 (606c), and 00 (606d) for selecting from table 2 (614) an elemental length component for each subset included in the selected generic code sequence B B B A2. As shown in FIG. 6 and with reference to table 2 (614), subset B of superior elemental length components is associated with the 2-bit binary address 01 (606a) to select the elemental length component 1100; subset B of superior elemental length components is associated with the 2-bit binary address 11 (606b) to select the elemental length component 1110; subset B of superior elemental length components is associated with the 2-bit binary address 00 (606c) to select the elemental length component 0110; subset A2 of inferior elemental length components is associated with the 2-bit binary address 00 (606d) to select the elemental length component 0101. The selected sequence of elemental length components is 1100 1110 0110 0101. Major component 616a includes the selected sequence of elemental length components.

Third portion 608 contains an uncoded bit having a binary value of 1. Third portion 608 corresponds to minor component 616b and is appended to major component 616a to generate the 17 bit codeword 1100 1110 0110 0101 1.

Figure 7:
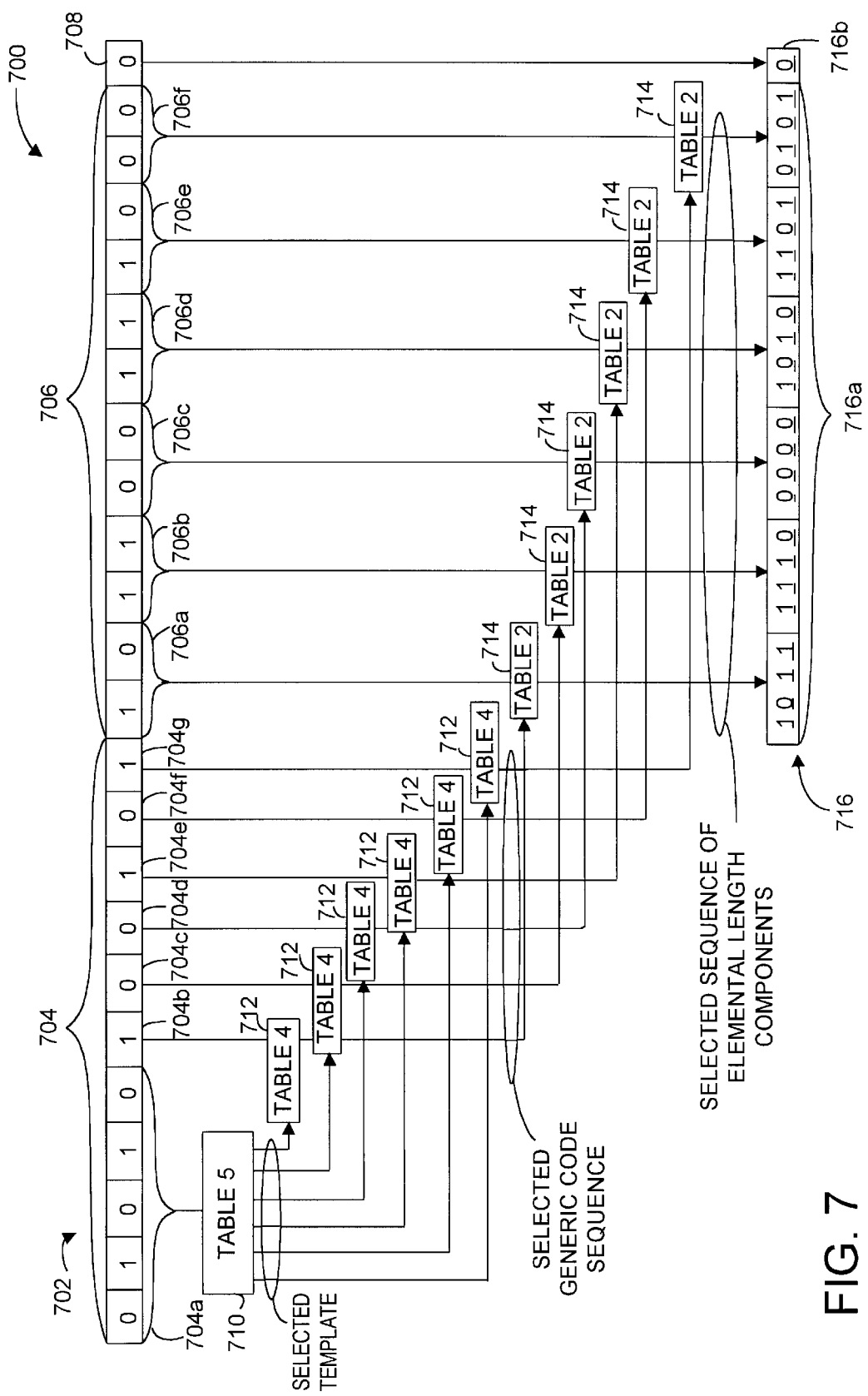
FIG. 7 is a diagram illustrating a process for encoding a 24 bit input data block into a 25 bit codeword according to another embodiment of the invention.

Referring to FIG. 7, process flow 700 illustrates a process according to another embodiment of the invention for receiving a 24 bit ($b_0, \ldots, b_{23}$) input data block 702 and generating a 25 bit ($c_0, \ldots, c_{24}$) codeword 716. Input data block 702 is partitioned into a first portion 704 containing address locations 704a–704g, a second portion 706 containing six 2-bit address locations 706a–706f, and a third portion 708 containing an uncoded bit.

First portion 704a selects a template having a sequence of pointers $P^*_1 P^*_2 P^*_3 P^*_4 P^*_5 P^*_6$ from table 5 (710), the selected template pointing to a subset of elemental length components in table 4 (712). First portion 704b–704g is associated with the selected template pointers $P^*_1P^*_2P^*_3P^*_4P^*_5P^*_6$ to select a sequence of subsets of elemental length components from table 4 (712). The selected sequence of subsets of elemental length components corresponds to a generic code sequence having pointers $P_1P_2P_3P_4P_5P_6$ pointing to the set of elemental length components in table 2 (714).

Second portion 706 is associated with the selected generic code sequence $P_1P_2P_3P_4P_5P_6$ to select a sequence of elemental length components from table 2 (714). Third portion 708 is appended to the selected sequence of elemental length components to generate codeword 716.

Table 5 (710) includes 32 different decimal value addresses and corresponding templates, each template having a sequence of pointers $P^*_1P^*_2P^*_3P^*_4P^*_5P^*_6$ pointing to the subset of elemental length components in table 4 (712).

(706e), and 00 (706f) for selecting from table 2 (714) an elemental length component for each subset included in the selected generic code sequence C B A1 A2 B A2. As shown in FIG. 7 and with reference to table 2 (714), subset C of superior elemental length components is associated with the 2-bit binary address 10 (706a) to select elemental length component 1011; subset B of superior elemental length components is associated with the 2-bit binary address 11 (706b) to select the elemental length component 1110; subset A1 of inferior elemental length components is associated with the 2-bit binary address 00 (706c) to select elemental length component 0000; subset A2 of inferior elemental length components is associated with the 2-bit binary address 11 (706d) to select the elemental length component 1010; subset B of superior elemental length components is associated with the 2-bit binary address 10 (706e) to select the elemental length component 1101; subset A2 of superior elemental length components is asso-

TABLE 5

| DECIMAL VALUE OF FIRST PORTION 704a | TEMPLATE $P^*_1P^*_2P^*_3P^*_4P^*_5P^*_6$ | DECIMAL VALUE OF FIRST PORTION 704a | TEMPLATE $P^*_1P^*_2P^*_3P^*_4P^*_5P^*_6$ |
|---|---|---|---|
| 0  | G G G G G G | 16 | H G G H H G |
| 1  | G G G G G H | 17 | H G H G G G |
| 2  | G G G G H G | 18 | H G H G G H |
| 3  | G G G H G G | 19 | H G H G H G |
| 4  | G G G H G H | 20 | H G H H G G |
| 5  | G G G H H G | 21 | H G H H G H |
| 6  | G G H G G G | 22 | G H G G G G |
| 7  | G G H G G H | 23 | G H G G G H |
| 8  | G G H G H G | 24 | G H G G H G |
| 9  | G G H H G G | 25 | G H G H G G |
| 10 | G G H H G H | 26 | G H G H G H |
| 11 | H G G G G G | 27 | G H G H H G |
| 12 | H G G G G H | 28 | G H H G G G |
| 13 | H G G G H G | 29 | G H H G G H |
| 14 | H G G H G G | 30 | G H H G H G |
| 15 | H G G H G H | 31 | G H H H G G |

For example, process flow 700 includes receiving an input data block 702 having input data sequence 010101001011011001110000. First portion 704a includes a 5 bit address 01010 (decimal value=10) for selecting from table 5 (710) the template having pointers G G H H G H. Each of these pointers points to the subset of elemental length components in table 4 (712).

First portion 704b–704g includes six 1-bit addresses 1 (704b), 0 (704c), 0 (704d), 1 (704e), 0 (704f) 1 (704g) for selecting from table 4 a subset (A1, A2, B or C) of elemental length components for each subset in the selected template G G H H G H. As shown in FIG. 7 and with reference to table 4 (712), template pointer G is associated with the 1 bit binary address 1 (704b) to select subset C of superior elemental length components; template pointer G is associated with the 1-bit binary address 0 (704c) to select subset B of superior elemental length components; template pointer H is associated with the 1-bit binary address 0 (704d) to select subset A1 of inferior elemental length components; template pointer H is associated with the 1 bit binary address 1 (704e) to select subset member A2 of inferior elemental length components; template pointer G is associated with the 1-bit binary address 0 (704f) to select subset B of superior elemental length components; template pointer H is associated with the 1-bit binary address 1 (704g) to select subset A2 of inferior elemental length components. The selected sequence of subsets C B A1 A2 B A2 corresponds to the generic code sequence C B A1 A2 B A2.

Second portion 706a–706f includes six 2-bit binary addresses 10 (706a), 11 (706b), 00 (706c), 11 (706d), 10 ciated with the 2-bit binary address 00 (706) to select the elemental length component 0101. The selected sequence of elemental length components is 1011 1110 0000 1010 1101 0101. Major component 716a includes the selected sequence of elemental length components.

Third portion 708 contains an uncoded bit having a binary value of 0. Third portion 708 corresponds to minor component 716b and is appended to major component 716a to generate the 17 bit codeword 1011 1110 0000 1010 1101 0101 0.

Figure 8:
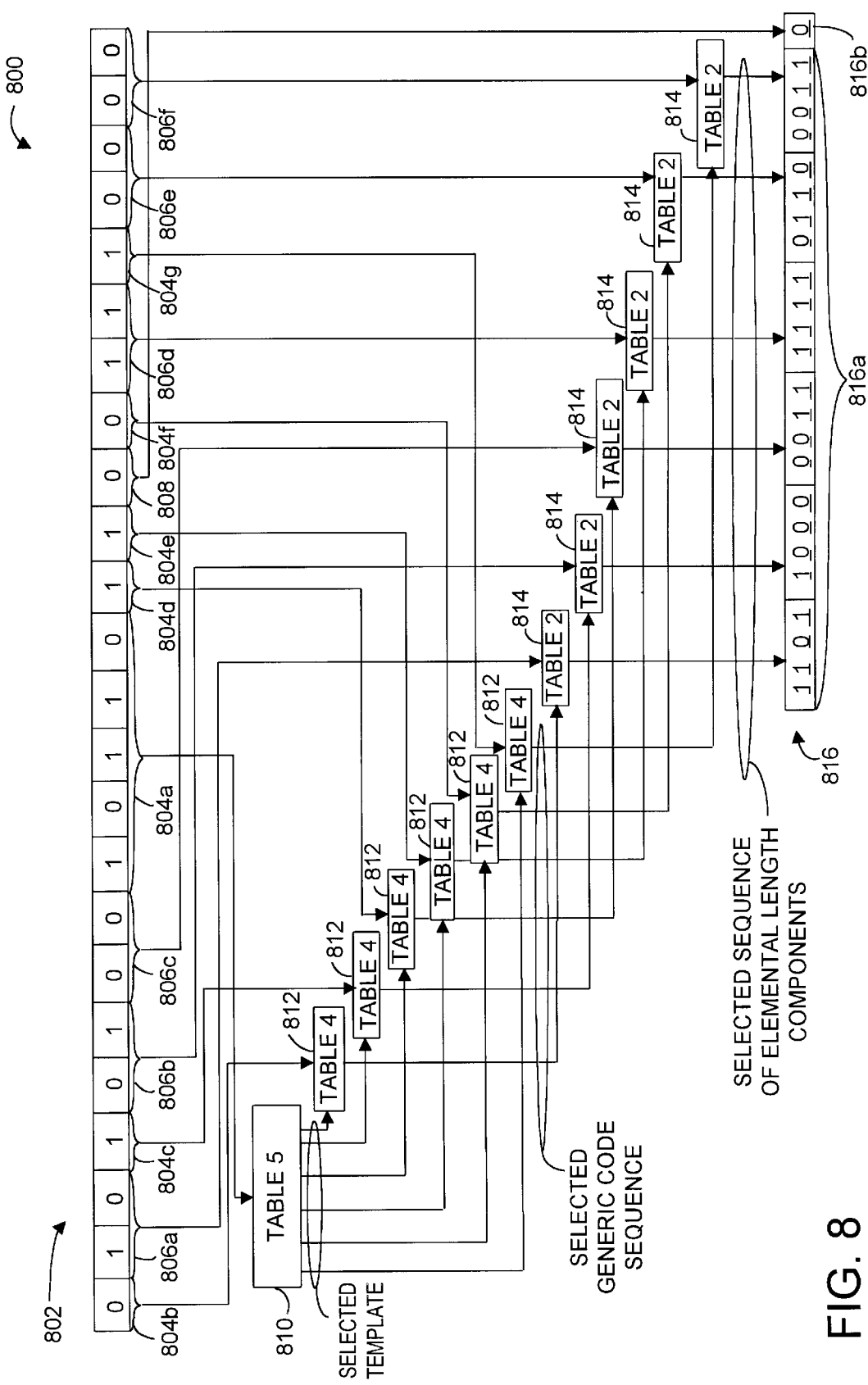
FIG. 8 is a diagram illustrating a process for encoding a 24 bit input data block into a 25 bit codeword according to another embodiment of the invention.

FIG. 8 illustrates a process according to another embodiment of the invention for receiving a 24 bit ($b_0, \ldots, b_{23}$) input data block 802 and generating a 25 bit ($c_0, \ldots, c_{24}$) codeword 816. Input data block 802 is partitioned into a first portion 804 containing address locations 804a–804g, a second portion 806 containing six 2-bit address locations 806a–806f, and a third portion 808 containing an uncoded bit.

First portion 804a selects a template having a sequence of pointers $P^*_1P^*_2P^*_3P^*_4P^*_5P^*_6$ from table 5 (810), the selected template pointing to a subset of elemental length components in table 4 (812). First portion 804b–804g is associated with the selected template pointers $P^*_1P^*_2P^*_3P^*_4P^*_5P^*_6$ to select a sequence of subsets of elemental length components from table 4 (812). The selected sequence of subsets of elemental length components corresponds to a generic code sequence having pointers $P_1P_2P_3P_4P_5P_6$ pointing to the set of elemental length components in table 2 (814).

Second portion 806 is associated with the selected generic code sequence $P_1P_2P_3P_4P_5P_6$ to select a sequence of elemental length components from table 2 (814). Third portion 808 is appended to the selected sequence of elemental length components to generate codeword 816.

For example, process flow 800 includes receiving an input data block 802 having input data bit sequence 0101010010110110011 10000. First portion 804a includes a 5 bit address 10110 (decimal value=22) for selecting from table 5 (810) the template having pointers G H G G G G. Each pointer points to the subset of elemental length components in table 4 (812).

First portion 804b–804g includes six 1-bit addresses 0 (804b), 1 (804c), 1 (804d), 1 (804e), 0 (804f) and 1 (804g) for selecting from table 4 (812) a subset (A1,A2,B, or C) of elemental length components for each subset in the selected template G H G G G G. As shown in FIG. 8 and with reference to table 4 (812), template pointer G is associated with the 1 bit binary address 0 (804b) to select subset B of superior elemental length components; template pointer H is associated with the 1-bit binary address 1 (804c) to select subset A2 of inferior elemental length components; template pointer G is associated with the 1-bit binary address 1 (804d) to select subset C of superior elemental length components; template pointer G is associated with the 1 bit binary address 1 (804e) to select subset member C of superior elemental length components; template pointer G is associated with the 1-bit binary address 0 (804f) to select subset B of superior elemental length components; template pointer G is associated with the 1-bit binary address 1 (804g) to select subset C of superior elemental length components. The selected sequence of subsets B A2 C C B C corresponds to the generic code sequence B A2 C C B C.

Second portion 806a–806f includes six 2-bit binary addresses 10 (806a), 01 (806b), 00 (806c), 11 (806d), 00 (806e), and 00 (806f) for selecting from table 2 (814) an elemental length component for each subset included in the selected generic code sequence B A2 C C B C. As shown in FIG. 8 and with reference to table 2 (814), subset B of superior elemental length components is associated with the 2-bit binary address 10 (806a) to select elemental length component 1101; subset A2 of inferior elemental length components is associated with the 2-bit binary address 0 1 (806b) to select the elemental length component 1000; subset C of superior elemental length components is associated with the 2-bit binary address 00 (806c) to select elemental length component 0011; subset C of superior elemental length components is associated with the 2-bit binary address 11 (806d) to select the elemental length component 1111; subset B of superior elemental length components is associated with the 2-bit binary address 00 (806e) to select the elemental length component 0110; subset C of superior elemental length components is associated with the 2-bit binary address 00 (806f) to select the elemental length component 0011. The selected sequence of elemental length components is 1101 1000 0011 1111 0110 0011. Major component 816a includes the selected sequence of elemental length components.

Third portion 808 contains an uncoded bit having a binary value of 0. Third portion 808 corresponds to minor component 816b and is appended to major component 816a to generate the 25 bit codeword 1101 1000 0011 1111 0110 0011 0.

Encoder Block Diagram

The following examples illustrate an encoder block diagram for receiving an input data block and generating a corresponding codeword.

Figure 9:
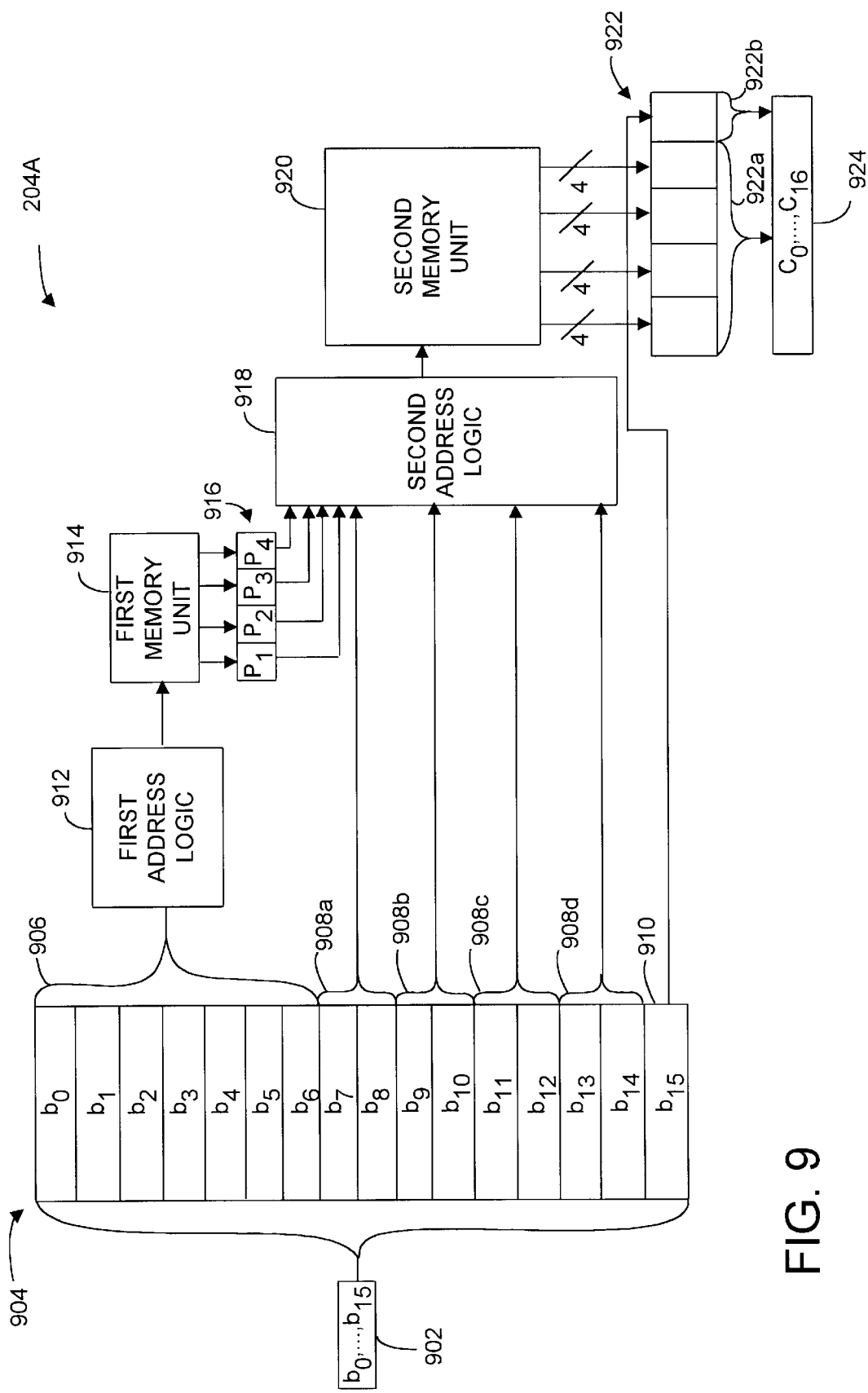
FIG. 9 is a block diagram of an encoder for encoding a 16 bit input data block into a 17 bit codeword according to an embodiment of the invention.

Referring to FIG. 9, encoder 204A receives a 16-bit ($b_0, \ldots, b_{15}$) input data block 902 and generates a 17-bit ($c_0, \ldots, c_{16}$) codeword 924 according to an embodiment of the invention. Encoder 204A includes an input register 904, a first address logic 912, a first memory unit 914, a generic code sequence register 916, a second address logic 918, a second memory unit 920, and a codeword register 922. Preferably, first memory unit 914 includes a lookup table corresponding to table 1 and second memory unit 920 includes a lookup table corresponding to table 2.

Input register 904 receives the 16-bit input data block 902 and provides a first portion 906 to first address logic 912, a second portion 908a–908d to second address logic 918, and a third portion 910 to codeword register 922.

First address logic 912 receives first portion 906 from input register 904 and selects a generic code sequence having pointers $P_1P_2P_3P_4$ from first memory unit 914, the selected generic code sequence pointing to a set of elemental length components in second memory unit 920. Generic code sequences register 916 receives the selected generic code sequence pointers $P_1P_2P_3P_4$ from first memory unit 914.

Second address logic 918 receives second portion 908a–908d from input register 904 and generic code sequence pointers $P_1P_2P_3P_4$ from generic code sequence register 916 to select a sequence of elemental length components from second memory unit 920. Codeword register 922 receives third portion 910 from input register 904 and the selected sequence of elemental length components from second memory unit 920 to generate codeword 924. Codeword 924 includes major component 922a and minor component 922b.

Figure 10:
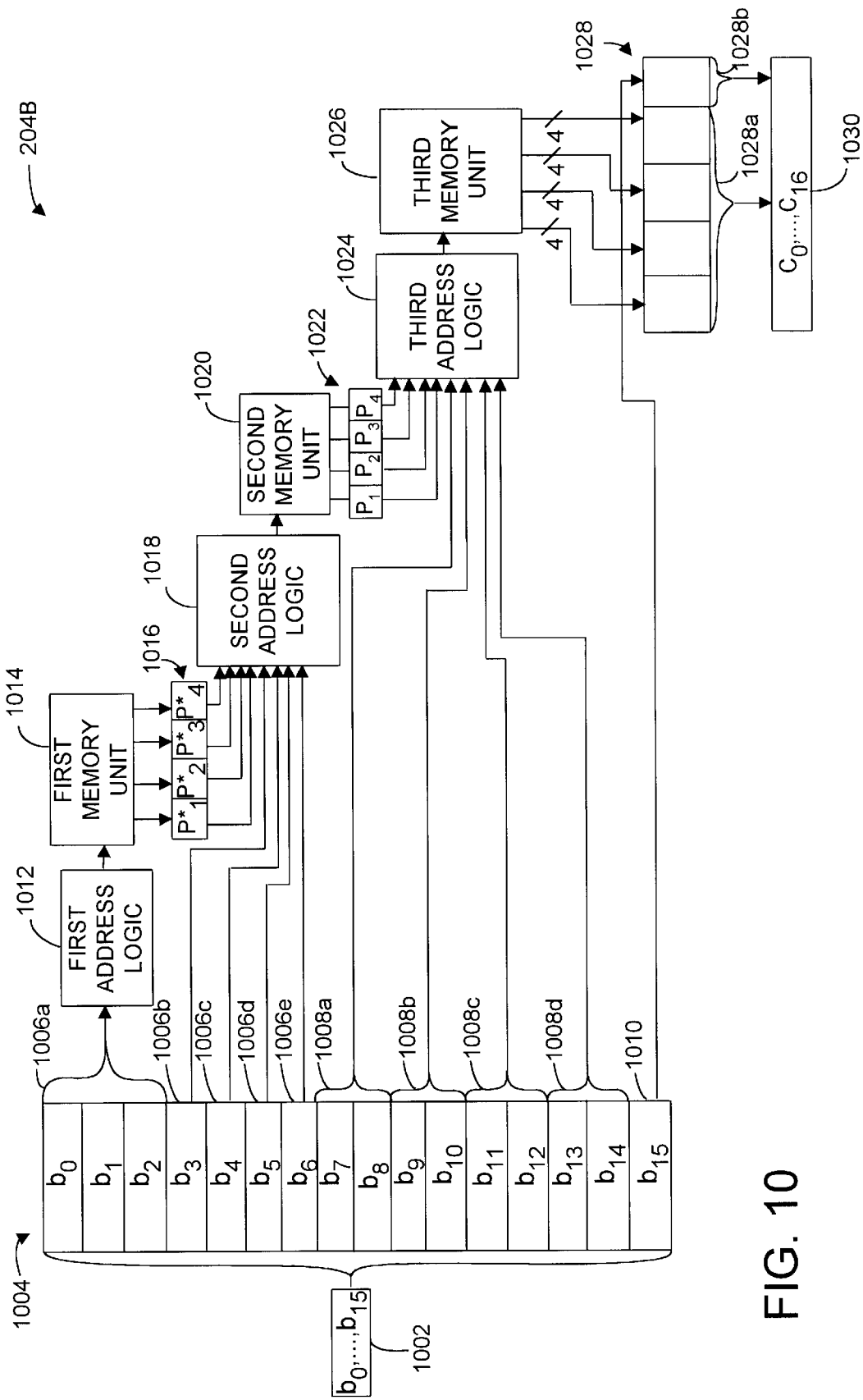
FIG. 10 is a block diagram of an encoder for encoding a 16 bit input data block into a 17 bit codeword according to another embodiment of the invention.

Referring to FIG. 10, encoder 204B receives a 16-bit ($b_0, \ldots, b_{15}$) input data block 1002 and generates a 17-bit ($c_0, \ldots, c_{16}$) codeword 1030 according to another embodiment of the invention. Encoder 204B includes an input register 1004, a first address logic 1012, a first memory unit 1014, a template register 1016, a second address logic address 1018, a second memory unit 1020, a generic code sequence register 1022, a third address logic 1024, a third memory unit 1026, and a codeword register 1028. Preferably, first memory unit 1014 includes a lookup table corresponding to table 3, second memory unit 1020 includes a lookup table corresponding to table 4, and third memory unit 1026 includes a lookup table corresponding to table 2.

Input register 1004 receives input data block 1002 and provides a first portion 1006a to first address logic 1012, a first portion 1006b–1006e to second address logic 1018, a second portion 1008a–1008d to third address logic 1024, and a third portion 1010 to codeword register 1028.

First address logic 1012 receives first portion 1006a from input register 1004 and selects a template having pointers $P^*_1P^*_2P^*_3P^*_4$ from first memory unit 1014, the selected template pointing to a subset of elemental length components in second memory unit 1020. Template register 1016 receives the selected template pointers $P^*_1P^*_2P^*_3P^*_4$ from first memory unit 1014.

Second address logic 1018 receives first portion 1006b–1006e from input register 1004 and the selected template $P^*_1P^*_2P^*_3P^*_4$ from template register 1016 to select a sequence of subsets of elemental length components from second memory unit 1020. The selected sequence of subsets of elemental length components corresponds to a generic code sequence having pointers $P_1P_2P_3P_4$ pointing to a set of elemental length components in third memory unit 1026. Generic code sequence register 1022 receives the selected generic code sequence from second memory unit 1020.

Third address logic 1024 receives second portion 1008a–1008d from input register 1004 and generic code sequence pointers P₁P₂P₃P₄ from generic code sequence register 1022 to select a sequence of elemental length components from third memory unit 1026. Codeword register 1028 receives third portion 1010 from input register 1004 and the selected sequence of elemental length components from third memory unit 1026 to generate codeword 1030. Codeword 1030 includes major component 1028a and minor component 1028b.

We claim:

1. A method for encoding an input data block into a codeword, the input data block having a first predetermined number of bits, the codeword having a second predetermined number of bits, the ratio of first predetermined number of bits to second predetermined number of bits being greater than ¾, the method being performed in a sampled data channel in a storage system, the data channel including a circuit the performance of which is adversely affected by an excessive run length of bits between occurrences of a predetermined multibit influential pattern, the method comprising the steps of:

receiving the input data block; and
    generating the codeword responsive to the received input data block;
    wherein:
        the codeword having a constraint on the maximum run length of a plurality of bits between occurrences of the multibit influential pattern;
        the maximum run length of the plurality of bits being less than or equal to the second predetermined number of bits; and
        the plurality of bits comprises at least one "0" bit and at least one "1" bit.

2. The method of claim 1 wherein the multibit influential pattern is a pair of adjacent binary ones.

3. The method of claim 1 wherein the step of generating the codeword includes:

selecting a generic code sequence in response to a first portion of the input data block, the generic code sequence pointing to a set of elemental length components;
    selecting a sequence of elemental length components from the set of elemental length components in response to a second portion of the input data block; and
    appending a third portion of the input data block to the selected sequence of elemental length components.

4. The method of claim 3 wherein:

the generic code sequence includes a sequence of pointers, each pointer pointing to the set of elemental length components;
    the set of elemental length components includes a subset of inferior elemental length components and a subset of superior elemental length components, each elemental length component in the subset of superior elemental length component including the multibit influential pattern, the multibit influential pattern containing a pair of adjacent binary ones; and
    each elemental length component containing a 4 bit sequence.

5. The method of claim 1 wherein the ratio of first number of bits to second number of bits is selected from the group consisting of: 8/9, 16/17, 24/25, 32/33.

6. A method for encoding a sequence of input data blocks into a sequence of codewords, each input data block having a first predetermined number of bits, each codeword having a second predetermined number of bits, the ratio of first predetermined number of bits to second predetermined number of bits being greater than ¾, the method being performed in a sampled data channel in a storage system, the data channel including a circuit the performance of which is adversely affected by an excessive run length of bits between occurrences of a predetermined multibit influential pattern, the method comprising the steps of:

receiving the sequence of input data blocks; and
    generating the sequence of codewords responsive to the received sequence of input data blocks;
    wherein:
        the sequence of codewords having a constraint on the maximum run length of a plurality of bits between occurrences of the multibit influential pattern;
        the maximum run length of the plurality of bits being less than or equal to the second predetermined number of bits; and
        the plurality of bits comprises at least one "0" bit and at least one "1" bit.

7. The method of claim 6 wherein the multibit influential pattern is a pair of adjacent binary ones.

8. The method of claim 6 wherein the step of generating the sequence of codewords includes generating a codeword for each input data block in the sequence, the step of generating the codeword for each input data block includes:

selecting a generic code sequence in response to a first portion of the input data block, the generic code sequence pointing to a set of elemental length components;
    selecting a sequence of elemental length components from the set of elemental length components in response to a second portion of the input data block; and
    appending a third portion of the input data block to the selected sequence of elemental length components.

9. The method of claim 8 wherein:

the generic code sequence includes a sequence of pointers, each pointer pointing to the set of elemental length components;
    the set of elemental length components includes a subset of inferior elemental length components and a subset of superior elemental length components, each elemental length component in the subset of superior elemental length component including the multibit influential pattern, the multibit influential pattern containing a pair of adjacent binary ones; and
    each elemental length component containing a 4 bit sequence.

10. The method of claim 6, wherein the ratio of first number of bits to second number of bits is selected from the group consisting of: 8/9, 16/17, 24/25, 32/33.

11. A method for encoding a sequence of input data blocks into a sequence of codewords, each input data block having a first predetermined number of bits, each codeword having a second predetermined number of bits.

12. The method of claim 11, wherein the maximum run length is less than or equal to the second predetermined number of bits.

13. The method of claim 11, wherein the multibit influential pattern is a pair of adjacent binary ones.

14. An apparatus for encoding an input data block into a codeword, the input data block having a first predetermined number of bits, the codeword having a second predetermined number of bits, the ratio of first predetermined number of bits to second predetermined number of bits being greater than ¾, the apparatus being a part of a sampled data channel in a storage system, the data channel including a circuit the performance of which is adversely affected by an excessive run length of bits between occurrences of a predetermined multibit influential pattern, the apparatus comprising:

means for receiving the input data block; and means for generating the codeword responsive to the received input data block;

wherein:

the codeword having a maximum run length of a plurality of bits between occurrences of the multibit influential pattern;

the maximum run length of the plurality of bits being less than or equal to the second predetermined number of bits; and the plurality of bits comprises at least one "0" bit and at least one "1" bit.

15. The apparatus of claim 14 wherein the multibit influential pattern is a pair of adjacent binary ones.

16. The apparatus of claim 14 wherein the means for generating the codeword comprises:

means for selecting a generic code sequence in response to a first portion of the input data block, the generic code sequence pointing to a set of elemental length components;

means for selecting a sequence of elemental length components from the set of elemental length components in response to a second portion of the input data block; and means for appending a third portion of the input data block to the selected sequence of elemental length components.

17. An apparatus for encoding a sequence of input data blocks into a sequence of codewords, each input data block having a first predetermined number of bits, each codeword having a second predetermined number of bits, the ratio of first predetermined number of bits to second predetermined number of bits being greater than ¾, the apparatus being a part of a sampled data channel in a storage system, the data channel including a circuit the performance of which is adversely affected by an excessive run length of bits between occurrences of a predetermined multibit influential pattern, the apparatus comprising:

means for receiving the sequence of input data blocks; and means for generating the sequence of codewords responsive to the received sequence of input data blocks;

wherein:

the sequence of codewords having a constraint on the maximum run length of a plurality of bits between occurrences of the multibit influential pattern;

the maximum run length of the plurality of bits being less than or equal to the second predetermined number of bits; and the plurality of bits comprises at least one "0" bit and at least one "1" bit.

18. A method of operating a read channel in a storage system having a storage media and a read transducer, the method comprising the steps of:

operating the read transducer to generate a sequence of code bits recorded on the storage media;

operating a circuit to generate a sequence of codewords derived from the sequence of code bits, each codeword having a predetermined number of code bits, wherein:

the sequence of codewords having a constraint on the maximum run length of a plurality of code bits between occurrences of a predetermined multibit influential pattern;

the maximum run length of the plurality of code bits being less than or equal to the predetermined number of code bits;

the occurrence of the multibit influential pattern substantially influencing the performance of the circuit; and the plurality of bits comprises at least one "0" bit and at least one "1" bit;

operating a decoder to convert the sequence of codewords into corresponding sequence of data blocks.

\* \* \* \* \*